United States Patent [19]

Cubbison, Jr.

[11] 4,125,813

[45] Nov. 14, 1978

[54] OPERATIONAL AMPLIFIER DECOUPLING CIRCUIT

[75] Inventor: Richard J. Cubbison, Jr., Littleton, Colo.

[73] Assignee: Bell Telephone Laboratories, Incorporated, Murray Hill, N.J.

[21] Appl. No.: 804,876

[22] Filed: Jun. 9, 1977

[51] Int. Cl.² .............................................. H03F 1/08
[52] U.S. Cl. .................................. 330/104; 328/151; 330/259; 330/261; 330/296
[58] Field of Search .................. 330/9, 104, 252, 259, 330/260, 261, 296; 328/151, 162; 307/352, 353

[56] References Cited

U.S. PATENT DOCUMENTS

| 3,812,383 | 5/1974 | Scheinberg | 328/151 X |
| 3,988,689 | 10/1976 | Ochi et al. | 328/151 X |

OTHER PUBLICATIONS

Choice, "Series-Connected Op Amps Null Offset Voltage," Electronics, Mar. 27, 1972, p. 92.
Naylur, "Digital and Analog Signal Applications of Operational Amplifiers," IEEE Spectrum, May 1971, pp. 79–87.

Primary Examiner—James B. Mullins
Attorney, Agent, or Firm—James M. Graziano

[57] ABSTRACT

A sample and hold circuit is disclosed which employs a matched pair of operational amplifiers as a decoupling circuit to isolate the output of the sample and hold circuit from the sampling capacitor. Prior art decoupling circuits employ a simple isolation amplifier which has a tendency to charge the sampling capacitor with the isolation amplifier input bias and leakage currents. The disclosed decoupling circuit employs one of a pair of matched operational amplifiers as a self-compensating isolation amplifier which dynamically generates the bias and leakage currents found at its input while isolating the sample and hold output from the sampling capacitor. The other operational amplifier is connected in series between the isolation amplifier and the sample and hold output and functions to cancel the input bias current signal generated by the self-compensating isolation amplifier. Thus, the net quiescent current into the input of the decoupling circuit is essentially zero, thereby eliminating the capacitor charging problem of prior art isolation amplifiers.

7 Claims, 3 Drawing Figures

OPERATIONAL AMPLIFIER DECOUPLING CIRCUIT

This application is related to an application of R. J. Cubbison, Jr., entitled "Operational Amplifier Decoupling Circuit", filed on the same date hereof.

FIELD OF THE INVENTION

The disclosed invention relates to sample and hold circuits and in particular to a decoupling circuit employing a matched pair of operational amplifiers, which decoupling circuit essentially has a net quiescent input current of zero.

DESCRIPTION OF PRIOR ART

A sample and hold module is a device that tracks an input signal and then holds the instantaneous input value upon command by a logic control circuit. The simplest sample and hold configuration is a switch and sampling capacitor combination. The switch is connected in series between the input and output terminals of the sample and hold module while the sampling capacitor is connected across the output terminals. While the switch is closed, the output voltage will be identical to the input voltage. Once the switch is opened, the sampling capacitor provides the memory, holding the output voltage at the value last monitored at the module input terminals.

The difficulty with this configuration is that any load connected to the sample and hold output terminals will quickly discharge the sampling capacitor thereby destroying the information content of the sampling capacitor. To alleviate this problem, prior art sample and hold circuits employ a unity gain isolation amplifier connected between the sampling capacitor and the module output terminals.

However, sample and hold circuit isolation amplifiers have variable input bias and leakage currents which charge the sampling capacitor, thus introducing a nonlinear random error component into the resultant signal. Prior art solutions to this sampling capacitor charging problem employ field effect transistor (FET) operational amplifiers to reduce the leakage currents and, thus, proportionately reduce this error component. However, high quality FET operational amplifiers are expensive and an inexpensive resolution to the sampling capacitor charging problem was sought. Therefore, it is desirable in sample and hold circuits to utilize decoupling circuitry that provides both low leakage and bias currents and a high input impedance in order that the decoupling circuitry will not modify the data stored in the sampling capacitor.

In view of the foregoing, it is an object of this invention to provide a decoupling circuit that does not affect the data stored in the sampling capacitor.

It is a further object of this invention to provide a decoupling circuit that presents a high input impedance to the sampling capacitor.

It is another object of this invention to provide a decoupling circuit that provides a high degree of isolation between input and output terminals.

SUMMARY OF THE INVENTION

In accordance with my invention, I provide an operational amplifier decoupling circuit that does not affect the information content of the sampling capacitor. This is accomplished by employing a matched pair of operational amplifiers to reduce the tendency of sample and hold circuits to charge the sampling capacitor with the isolation amplifier input bias and leakage currents. One of the matched pair of operational amplifiers is employed as a self-compensating isolation amplifier which dynamically generates the bias and leakage currents found at its input while isolating the sample and hold circuit output from the sampling capacitor. The other operational amplifier is connected in series between the isolation amplifier and the sample and hold output to cancel the input bias current signal generated by the self-compensating isolation amplifier input bias and leakage currents. The input bias and leakage current characteristics of the two operational amplifiers are closely matched, thus enabling the offset compensation amplifier to match the currents of the self-compensating isolation amplifier. This matching of the two amplifiers also assures excellent tracking and stability characteristics.

Accordingly, it is a feature of this invention to provide decoupling circuit facilities that reduce the net quiescent current into the sampling capacitor.

It is a further feature of this invention to provide isolation amplifier facilities that dynamically generate and supply the input bias and leakage currents required by the decoupling circuit.

It is a further feature of this invention to provide compensation circuit facilities that employ active circuitry to dynamically cancel the isolation amplifier input bias current signal.

BRIEF DESCRIPTION OF THE DRAWING

The operation and utilization of the present invention will be more fully apparent from the following description of the drawing in which.

GENERAL DESCRIPTION — FIGS. 1 AND 2

Figure 1:
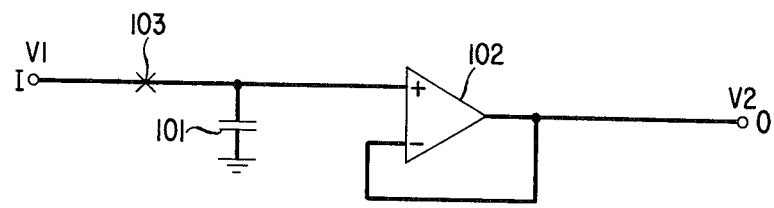
FIG. 1 illustrates a basic prior art sample and hold circuit.

FIG. 1 shows a basic prior art sample and hold circuit consisting of a sampling switch make contact 103, sampling capacitor 101 and operational amplifier 102. The operational amplifiers used in sample and hold circuits are well known in the art and are described in the book "Operational Amplifiers — Design and Applications" by Burr-Brown Research Corp. Engineering Staff, published by McGraw-Hill Company, 1971. Accordingly, the details of operational amplifier operation will not be discussed herein.

Input signal voltage VI appearing at input terminal I of the sample and hold circuit is connected through a closed make contact 103 of the sampling switch to sampling capacitor 101. Input signal voltage VI charges capacitor 101 to voltage level VI while switch 103 is closed. Operational amplifier 102 is connected in a unity gain configuration between sampling capacitor 101 and output terminal 0 of the sample and hold circuit. Operational amplifier 102 functions as a unity gain isolation amplifier, thereby providing voltage VI, as it appears on sampling capacitor 101, at sample and hold circuit output terminal 0 while isolating sampling capacitor 101 from any load applied to sample and hold circuit output terminal 0. Therefore, while switch 103 is closed, output voltage V2 equals input voltage VI. Once switch 103 is opened, capacitor 101 provides the memory, maintaining voltage level V1 at the input of isolation amplifier 102, subject, however, to being discharged by the bias and leakage currents appearing at the input of isolation amplifier 102. Thus, the bias and leakage currents of isolation amplifier 102 modify the information content of capacitor 101 by changing the voltage level stored thereon from V1 to some other value, determined by the leakage and bias currents is isolation amplifier 102. Output voltage V2 tracks the voltage level appearing on sampling capacitor 101 and, therefore, output signal V2 contains an error component determined by the random value of the input bias and leakage currents of unity gain isolation amplifier 102.

Figure 2:
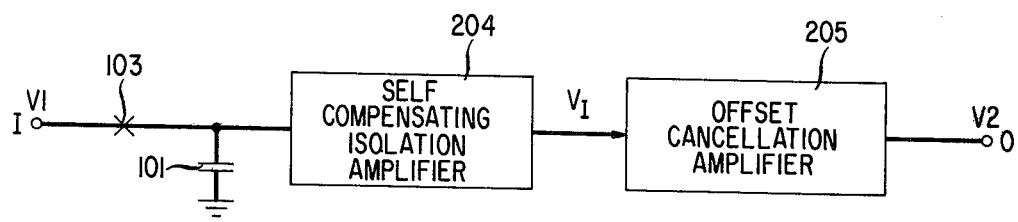
FIG. 2 illustrates one embodiment of my invention in block diagram form.

FIG. 2 illustrates one embodiment of my invention in block diagram form, wherein isolation amplifier 102 has been replaced by self-compensating isolation amplifier 204. Self-compensating isolation amplifier 204 supplies itself with the required input bias and leakage currents, thereby solving the capacitor charging problem of prior art isolation amplifiers. However, in achieving a net quiescent current of zero into the decoupling circuit input, self-compensating isolation amplifier 204 generates an offset voltage which is proportional to the input bias and leakage currents. Offset compensation amplifier 205 is therefore connected in series between the output of self-compensating isolation amplifier 204 and the output of the sample and hold circuit to cancel this offset voltage.

Figure 3:
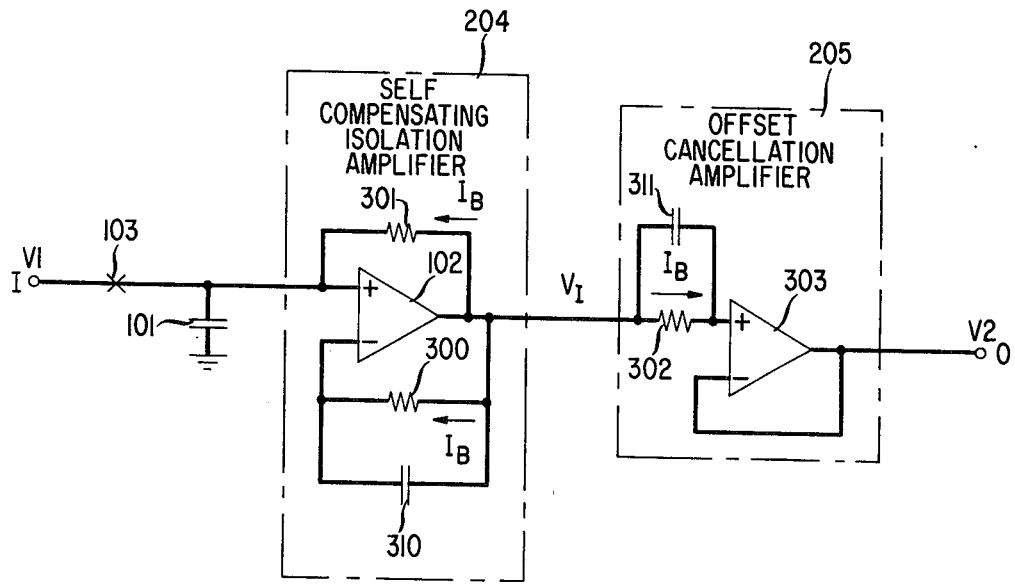
FIG. 3 shows a preferred embodiment of my invention.

Detailed Description — FIG. 3

FIG. 3 discloses the preferred embodiment of my invention wherein self-compensating isolation 204 of FIG. 2 is implemented by standard isolation amplifier 102 and feedback resistances 301 and 300 connected between isolation amplifier 102 output terminal and its positive and negative input terminals respectively. Offset compensation amplifier 205 of FIG. 2 is implemented by operational amplifier 303, which has its output terminal connected to its negative input terminal while series resistance 302 is connected between operational amplifier 303 positive input terminal and the output of self-compensating isolation amplifier 204.

Resistors 300, 301 and 302 are well selected to be equal in value, and this value is designated as R ohms for the sake of this disclosure. Therefore, operational amplifier 102 is connected in the unity gain configuration, and feedback resistors 300 and 301 enable operational amplifier 102 to sense its own input leakage and bias currents, which appear on the negative input terminal of operational amplifier 102. Therefore, operational amplifier 102 generates an output voltage signal consisting of two components, the first being the voltage signal V1 appearing on sampling capacitor 101, and the second being operational amplifier 102 input bias and leakage currents, which are designated in FIG. 3 as $I_B$ multiplied by the value of resistor 300.

The input bias and leakage currents of operational amplifier 102 are sensed by operational amplifier 102 at its negative input terminal via feedback resistor 300. Operational amplifier 102 therefore generates input bias and leakage currents $I_B$ and supplies this current to its positive input terminal via feedback resistor 301. The voltage drop across resistor 301 caused by current $I_B$ is, therefore, $I_B \times R$. The output voltage of operational amplifier 102, designated as $V_I$, is therefore equal to V1 + $I_B$R. However, as mentioned above, current $I_B$ is variable in value and the voltage $I_B$R therefore introduces a nonlinear random error component into output signal $V_I$.

Offset compensation amplifier 205 is connected between the output of self-compensating isolation amplifier 204 and the sample and hold output, terminal 0 on FIG. 3, to cancel the effects of the nonlinear random error component introduced into the output signal by self-compensating isolation amplifier 204 offset voltage, $I_B \times$ R. This is accomplished by employing operational amplifier 303, which is connected in the unity gain configuration, with series resistor 302 connected between the positive input terminal of operational amplifier 303 and the output of self-compensating isolation amplifier 204. Operational amplifiers 102 and 303 are selected to be a matched pair of operational amplifiers and the characteristics are, therefore, closely matched, including the input bias and leakage current characteristics. Thus, the input bias and leakage currents $I_B$ required by the input of operational amplifier 102 is equal to the input bias and leakage currents $I_B$ required by the input of operational amplifier 303. Since resistors 300, 301 and 302 are all equal in value, the voltage drop across resistor 302 is equal to $-I_B \times$ R, thereby cancelling the nonlinear random error component introduced into the output signal by the offset voltage $I_B \times$ R of self-compensating isolation amplifier 204. The sample and hold output voltage V2 is therefore equal to:

$$V2 = V1 + I_B R - I_B R = V1.$$

Thus, self-compensating isolation amplifier 204 generates the input bias and leakage currents, $I_B$, required at its input terminal while presenting a high impedance to signals appearing on sampling capacitor 101. Offset compensation amplifier 205 requires the same input bias and leakage currents $I_B$ as required by self-compensating isolation amplifier 204, thereby cancelling the offset voltage generated by the input bias and leakage currents $I_B$ of self-compensating isolation amplifier 204. The disclosed decoupling circuit isolates the sample and hold output from sampling capacitor 101 without altering the information content of sampling capacitor 101. The net quiescent current into sampling capacitor 101 is essentially equal to zero and the input signal voltage V1, is maintained in the sample and hold circuit memory, thereby enabling the sample and hold circuit to maintain constant output voltage of V1.

Capacitors 310 and 311 are shown connected across resistors 300 and 302, respectively. These capacitors are employed to cancel the effects of the respective operation amplifier input capacitances. Otherwise, the series resistor — input capacitance combination tends to act somewhat as a low-pass filter. The need for capacitors 310 and 311 as well as the values required are determined by both the input capacitance of operational amplifiers 102 and 303 as well as the frequency of the signals applied to the input I of the disclosed decoupling circuit.

While a specific embodiment of the invention has been disclosed, variations in procedural and structural detail, within the scope of the appended claims, are possible and are contemplated. There is no intention of limitation to what is contained in the abstract or the exact disclosure as herein presented. The above-described arrangements are only illustrative of the application of the principles of my invention. Normally, other arrangements may be devised by those skilled in the art without departing from the spirit and the scope of my invention.

What is claimed is:

1. A decoupling circuit comprising:
   an input terminal;
   an output terminal;
   isolation amplifier means having an input and an output terminal, said isolation amplifier means input terminal being connected to said decoupling circuit input terminal, said isolation amplifier means output terminal being connected to said decoupling circuit output terminal for isolating said decoupling circuit output terminal from said decoupling circuit input terminal;
   wherein said isolation amplifier means generates and supplies its own dc input bias current by sensing its own dc input bias current;
   input bias current compensation means connected between said isolation amplifier means output terminal and said decoupling circuit output terminal for generating a compensation signal to dynamically cancel the input bias current signal generated by said isolation amplifier means; and
   wherein said input bias current compensation means senses its own input bias current signal to generate said compensation signal.

2. The invention of claim 1 wherein said isolation amplifier means comprises a first operational amplifier of a matched pair of operational amplifiers and said offset compensation means comprises a second operational amplifier of said matched pair of operational amplifiers.

3. The invention of claim 2 wherein each said operational amplifier of said matched pair of operational amplifiers has an output terminal, a positive input terminal, and a negative input terminal;
   wherein said output terminal of said second operational amplifier is connected via a feedback path to said negative input terminal of said second operational amplifier;
   wherein said isolation amplifier means additionally comprises a first and a second feedback impedance connected between said first operational amplifier output terminal and said first operational amplifier positive input and negative input terminals respectively; and
   wherein said offset compensation means includes a series impedance connected between said second operational amplifier positive input terminal and said isolation amplifier means output terminal.

4. The invention of claim 3 wherein said first feedback, said second feedback and said series impedances each comprise a resistor, the values of said resistors all being equal.

5. A decoupling circuit comprising:
   an input terminal;
   an output terminal;
   a first operational amplifier having a positive input, a negative input, and an output terminal, said first operational amplifier positive input terminal being connected to said decoupling circuit input terminal for isolating said decoupling circuit output terminal from said decoupling circuit input terminal;
   a first and a second feedback impedance connected between said first operational amplifier output terminal and said first operational amplifier positive input and negative input terminals respectively for dynamically supplying said first operational amplifier with dc input bias current; and
   a second operational amplifier having a positive input, a negative input, and an output terminal, said second operational amplifier output terminal being connected to said decoupling circuit output terminal and said second operational amplifier negative input terminal, said second operational amplifier positive input terminal being connected by a series impedance to said first operational amplifier output terminal for cancelling the offset voltage appearing at said first operational amplifier output terminal.

6. The invention of claim 5 wherein said first operational amplifier and said second operational amplifier comprise a matched pair of operational amplifiers.

7. The invention of claim 6 wherein said first feedback, said second feedback, and said series impedances each comprise a resistor, the values of said resistors all being equal.

* * * * *